United States Patent
Brzozowski et al.

(10) Patent No.: US 6,538,405 B1
(45) Date of Patent: Mar. 25, 2003

(54) ACCESSORY CONTROL SYSTEM

(75) Inventors: Mark Brzozowski, Northbrook, IL (US); Balagru K. Veloo, Gurnee, IL (US); Roger J. Crossley, Gurnee, IL (US)

(73) Assignee: The Cherry Corporation, Waukegan, IL (US)

( * ) Notice: Subject to any disclaimer, the term of this patent is extended or adjusted under 35 U.S.C. 154(b) by 0 days.

(21) Appl. No.: 09/560,623

(22) Filed: Apr. 28, 2000

(51) Int. Cl.[7] .............................. H02P 1/00; H02P 1/22; H02P 1/40; H02P 3/00; H02P 3/20
(52) U.S. Cl. .................... 318/280; 307/10.1; 303/20; 361/707
(58) Field of Search ................ 318/460–466, 318/565, 603, 139, 259, 262, 280; 307/10.1; 280/840, 690; 340/825.06; 303/20; 257/206, 714, 715; 361/707, 719

(56) References Cited

U.S. PATENT DOCUMENTS

| | | | |
|---|---|---|---|
| 4,463,426 A | | 7/1984 | Caddick et al. ............. 364/424 |
| 4,510,426 A | * | 4/1985 | Michaels et al. |
| 4,626,750 A | * | 12/1986 | Post |
| 4,697,092 A | * | 9/1987 | Roggendorf et al. |
| 4,845,708 A | * | 7/1989 | Herrmann, Jr. et al. |
| 4,956,561 A | * | 9/1990 | Tamer |
| 5,081,586 A | * | 1/1992 | Barthel et al. |
| 5,179,328 A | | 1/1993 | Furuse et al. ................ 318/603 |
| 5,197,007 A | | 3/1993 | Parker .................... 364/424.05 |
| 5,331,258 A | * | 7/1994 | Lankin et al. |
| 5,350,983 A | * | 9/1994 | Miller et al. |
| 5,497,326 A | | 3/1996 | Berland et al. ........ 364/424.05 |
| 5,508,689 A | * | 4/1996 | Rado et al. |
| 5,610,507 A | * | 3/1997 | Brittan |
| 5,623,169 A | * | 4/1997 | Sugimoto et al. |
| 5,743,599 A | * | 4/1998 | Henderson et al. |
| 5,751,129 A | | 5/1998 | Vergin ....................... 318/467 |
| 5,866,862 A | | 2/1999 | Riffil ............................ 200/5 |
| 5,965,993 A | * | 10/1999 | Bak et al. |
| 5,966,291 A | * | 10/1999 | Baumel et al. |
| 5,990,573 A | * | 11/1999 | Granitz et al. |
| 6,137,169 A | * | 10/2000 | Pace |
| 6,259,978 B1 | * | 7/2001 | Feely |

FOREIGN PATENT DOCUMENTS

| | | | |
|---|---|---|---|
| JP | 2001-53481 A | * | 2/2001 |
| WO | WO 99/14072 | | 3/1999 |

* cited by examiner

*Primary Examiner*—Jeffrey Donels
(74) *Attorney, Agent, or Firm*—Brinks Hofer Gilson & Lione (57) ABSTRACT

The invention concerns an accessory control system for automobiles. The apparatus integrates the user controls, the power switches that drive the accessories and motors for the accessories, and feedback from the accessories to allow the control system to apply proper corrections to the accessories. The system desirably includes semiconductor memory as well, allowing a user to command the control system to position the accessory to predetermined positions.

34 Claims, 4 Drawing Sheets

ACCESSORY CONTROL SYSTEM

FIELD OF THE INVENTION

This invention relates to automotive accessories, and an apparatus that integrates the switches and controls for positioning automotive accessories. The apparatus eliminates many wire harnesses presently necessary for operation of such accessories, and replaces them with a single, integrated unit. The apparatus will work with or without a memory capability. The invention also comprises a method of operation of automotive accessories.

BACKGROUND OF THE INVENTION

This invention relates to automotive accessories, and in particular to automotive seat controls. Automobiles produced today often include a number of motorized accessories that may be positioned for the convenience of an operator or a passenger. These accessories include power seats, power sunroofs, power windows, and other conveniences such as power mirrors. Each operator of a vehicle, such as a husband and a wife, may have preferences for the exact position of the accessory. The axes of movement, for example in a seat, may include the forward or rearward position of the seat, the tilt of the seat, the lumbar support or backrest angle of the seat, and other conveniences, such as the length of the seat (bottom support) and headrest position.

Each axis of movement of each accessory requires a motor, typically a bi-directional DC motor, to position the accessory. The switch used by the operator or passenger to control the movement must be located in a position reasonably convenient for the user. However, the motor control is frequently located nearer to the motor and away from the operating switch. Thus, a conventional automotive seat control may have six or more switches located in a position convenient for the vehicle operator or passenger, but the switches communicate with a motor controller that is remote from the switches and closer to the motor itself. This may lead to a multiplicity of wiring harnesses, especially in accessories incorporating a memory feature.

This complexity tends to make the manufacture of such systems expensive, and also complicates the installation of such systems into an automobile, since each motor must have two harnesses: one for the controller and one for the operator control. The motor controls may be located near the motors and away from the operating switches because the motor typically requires high current for its operation, and the operation of the motor for even brief periods generates heat. What is needed is a control system for automotive accessories that eliminates the number of wiring harnesses by integrating the controls and operating switches into a common housing. It is also desirable to control and reduce the thermal effects from operation of the motors.

BRIEF SUMMARY OF THE INVENTION

The control system consists of a single housing that has inputs from a power source, and outputs to each motor of a vehicle accessory, such as a power seat. In one aspect of the invention, requiring no memory, the control switches used by the user to position the accessory are mounted in a housing. The housing is positioned in a location convenient to the user, so that the user may readily adjust the accessory by fingertip adjustment of the control switches. The housing also contains means to supply power to each motor. Thus, the housing will contain one or more solid-state switches that supply electrical power to each motor. The control switches are thus mounted in the same housing as the power switches, and any other controls necessary or desirable for operation of the accessory. A microcontroller-based memory and control may also be used to add control functions of the accessory system.

This invention eliminates a multiplicity of wiring harnesses by placing all the switches and controls for operating a vehicle accessory into a single package. The only wiring necessary is for a power source to the controller, and a wiring harness to each motor or other powered accessory. The present high current switches used to switch the current directly are used to signal a control system in the housing. The housing also includes solid-state power switches, and a thermal management system to control excess heat generated by the system. Using the present high-current switches allows for a plug-in replacement for systems presently in operation.

Because the housing contains power circuits, heat will be generated during the period when power is supplied to the motor. One aspect of the invention is a thermal management system that will dissipate the heat so generated, conducting heat away from the heat sources. Another aspect of the invention is that a memory capability may be added. This capability would allow the control system to store and recall a position for the accessory. The memory would desirably be able to store and recall position data from more than one user. Thus, the invention could recall and apply stored position data from a user upon command.

DETAILED DESCRIPTION OF THE INVENTION

One aspect of the invention is the elimination of wiring harnesses, especially in accessory systems featuring a memory capability and utilizing feedback from the accessory to store its position. Another aspect of the invention is the location of all control and power components needed to operate vehicle accessory motors, into one conveniently-located housing. In this aspect of the invention, high current switches to operate the motors are mounted in the same housing as the user-control switches. Another aspect of the invention allows the use of the same switches and connectors currently used, in some cases as a drop-in replacement. High-current J-switches are typically used in accessory applications to switch power to a remote motor controller.

In one aspect of the invention, these J-switches are used to control a solid-state switch and provide power to the accessory motor, rather than utilizing the J-switches to provide power directly. Such a control system eliminates the mechanical relays, subject to wear and pitting, typically used in conventional accessory systems. Such relays are typically boxy and bulky, taking up a good deal of volume in the controller housing. One advantage of using solid-state switches is the considerably thinner package made possible by their use, and in this case, enabling an overall more-compact accessory control system.

Figure 1:
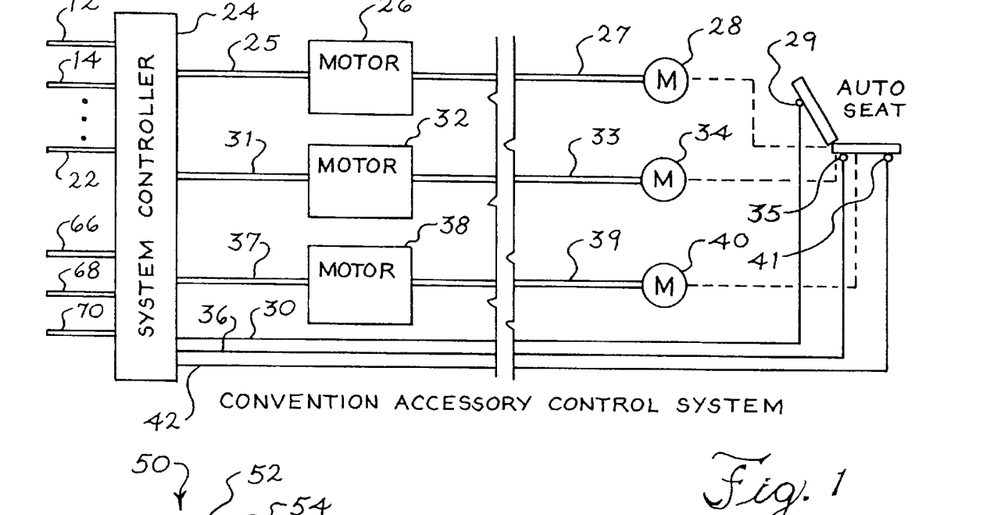
FIG. 1 is a block diagram of a conventional accessory control system.

FIG. 1 is a block diagram depicting a conventional accessory control system 10. In such a system, an operator, such as a driver, controls the position of the accessory by switches, typically located at his or her side. These may include a number of separate switches, such as an up switch 12, a down switch 14, a downward tilt switch 22, and the like. These switches signal a system controller 24, which may or may not include a memory feature. The controller sends signals to motor controllers 26, 32 and 38, which represent, respectively, controllers for motors that position and adjust motorized accessories to a vehicle. Typically, these adjustments will be for a vehicle seat, such as seat forward and backward, backrest tilt forward and backward, and seat angle up and down. Each such adjustment is actuated by a motor 28, 34 or 40, one motor for controlling each axis of adjustment of the accessory. It is desirable to include a position sensor for each axis of movement. The position sensors shown 29, 35 and 41, correspond to the axes of movement, and allow a memory feature of the controller 24 to continuously receive, update and store information on the location of each of the axes of movement. A user may store a desired position of the accessory by pushing a "set" button 66, and a "User #1" button 68 or a "User #2" button 70. A user who has a stored desired position in the controller memory recalls the position by pushing a button, such as "User #1."

The system depicted in FIG. 1 is needlessly complex, in that many harnesses of wire must be installed into a vehicle adapted to use the motorized accessory. As depicted in FIG. 1, the motor controllers are remote from the system controller, requiring wire harnesses 25, 31 and 37 for each motor controller. The harnesses 27, 33 and 39 from the motor controllers convey signals from the system controller to start and stop each individual motor. An additional harness may be required to transmit the electrical power from each motor controller to the motor itself. Finally, if feedback on the position of the accessory is desired, an additional harness may be required to transmit that feedback to the system controller. Such feedback sensors 29, 35 and 41, may require harnesses 30, 36 and 42 to transmit their information to the system controller.

Figure 2:
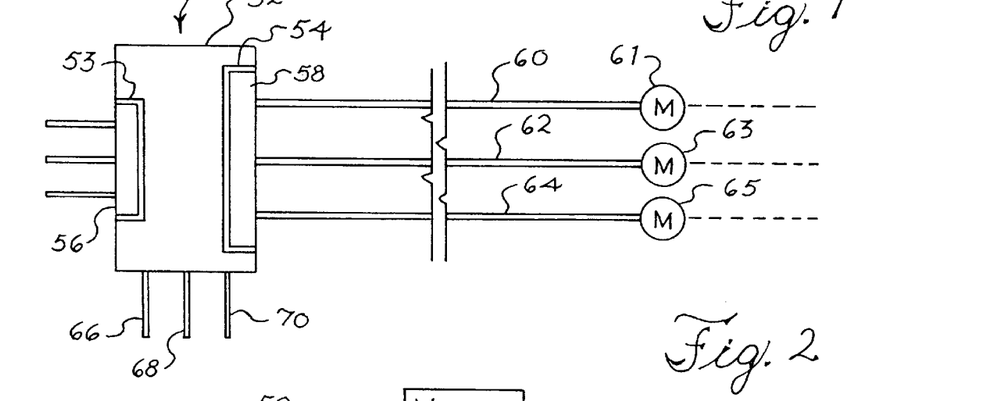
FIG. 2 is a diagram of the present invention in block form.

FIG. 2 conveys the present invention, an accessory control system 50, in block form. The control system consists of a housing 52, which includes an input connector 53 and an output connector 54. The input connector desirably receives a switch unit 56 for controlling the positions of a vehicle accessory, that is, manual switches for the user of the accessory. A six way switch made by the assignee of the present invention, The Cherry Corp. of Waukegan, Ill., is useful for performing the switching functions of three axes of movement of such an accessory. There is also an output connector 54, which connects the control system 50 to as many motors as there are axes of movement. The output connector 54 therefore interfaces with harness connector 58, and the output portion further comprises harnesses 60, 62, and 64 for motors 61, 63 and 65, one for each axis of movement. Shown are axes for a seatback able to recline, a seat having the ability to move forward and backward, and a seat bottom able to incline to a greater or lesser degree.

All other components necessary for the operation of the three motors depicted in FIG. 2 are contained within housing 52, except for the vehicle electrical system, which supplies regulated DC power and a chassis ground. Thus, all means for supplying power, downstream of the vehicle battery and voltage and current regulation system, are contained within the accessory control system housing. It is one aspect of this invention to use solid-state power switches, such as MOSFETs, to supply power to the motor or other powered accessory. Thus, the control switches for the accessory user and the power switches to the motor are contained within the housing.

One desirable aspect of the invention is that the parts are incorporated into a single housing. It is also desirable that the power distribution be accomplished by solid-state devices. These solid-state devices tend to be of small size, and may desirably include power transistors, integrated gate bipolar transistors (IGBTs), thyristors and MOSFETs. Therefore, they may be packaged into housings of smaller overall length and width, and may be desirably thin. It is possible and desirable for these parts to be mounted on a single printed circuit board, saving many parts interconnects, and assembly time. Alternatively, more than one printed circuit board may be used if convenient, in the housing.

It will be understood that the present invention is most desirably used in conjunction with a memory feature. If it is desired to incorporate a memory function into the control system, additional external switches may be necessary, shown in FIG. 2 as 66, 68, and 70. These switches may be "set," "user #1, " and "user #2." All components necessary in a control system incorporating memory are also contained within the housing.

Figure 3:
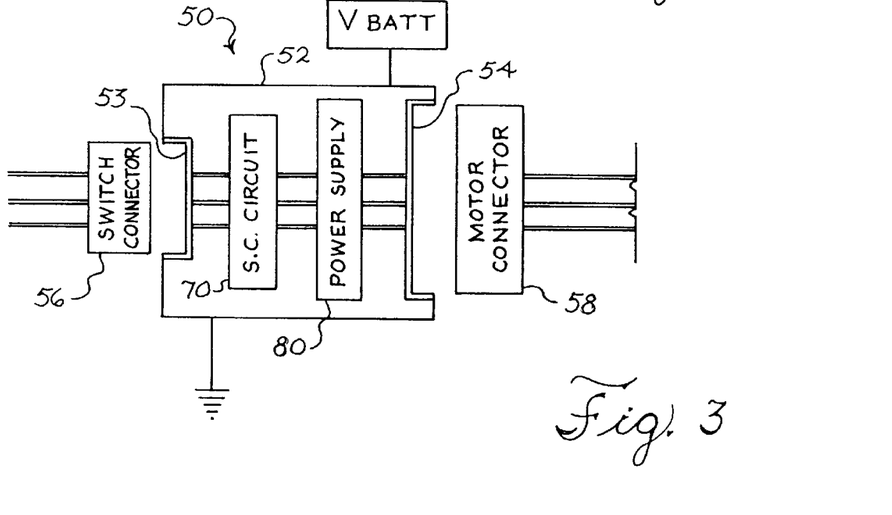
FIG. 3 is a diagram of the present invention without memory.

However, the benefits of the present invention may also be attained in an accessory control system without memory, as shown in FIG. 3. The control system 50 comprises a housing 52, an input connector 53 and an output connector 54. Interfacing to the input connector is a six-way switch 56, which is the means for controlling the axes of movement of a motorized accessory. Interfacing to the output connector is a harness connector 58, which conveys electrical power to the motors for the accessory. Contained within the housing is any desired signal conditioning circuitry, 70, and a power supply 80 for the motors.

In one way of practicing this invention, MOSFETs, or other solid-state switches, and associated circuitry, are used to supply power to the motor. Auxiliary and signal conditioning circuitry may consist of a voltage source, gate drives and linear or non-linear amplifiers. Another advantage of using solid-state switches, whether MOSFETs or other types, is the increasing variety and quality of such products. In many cases, these products are now used in consumer applications, including televisions, telecommunications products, and computers. The increasing volume of these parts has resulted in greater quality and lower prices, to the point where such products as video drivers and computer microcontrollers can be used for automotive accessory electronics. The availability of these parts in surface-mount versions also lowers manufacturing costs and can help in practicing this invention.

In another aspect of the invention, the control system includes a microcontroller that receives signals from the user-operated switches. The microcontroller then outputs a signal to a gate drive for each solid-state switch used to drive each motor of the accessory. It will be understood that the control system further comprises signal-conditioning circuitry between the user-operated switches and the microcontroller, and between the microcontroller and the gate drive. The microcontroller can include control routines that govern the signal to the gate drive, and thus the motor. These routines can include features that are well known in control systems, such as soft start to avoid high in-rush currents, soft stop to avoid wear and tear on the motor, speed control and current control to adjust the performance of the motor, and routines for other functions, such as routines to detect obstructions and stop the motor.

Figure 4:
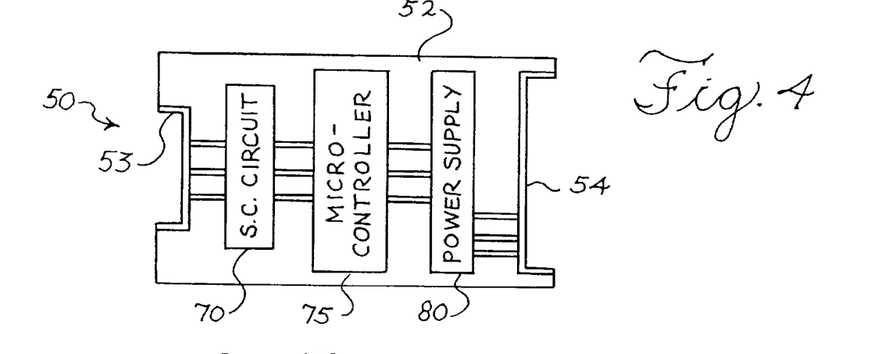
FIG. 4 is a block diagram of the present invention with a memory capability.

FIG. 4 depicts an embodiment of the present invention having a memory capability. It will be understood that the inputs to the accessory control system 50 are made through an input connector 53 and that the outputs to the motors are made through an output connector 54, the input and output connectors being connected to and mounted on the housing 52. The system shown has signal-conditioning circuitry 70, a microcontroller 75 with a memory capability, and power supply 80 for the motors. The means for supplying power to the motors are desirably solid-state electrical switches, preferably MOSFETs. The signal conditioning circuitry, the microcontroller, and the solid-state switches are desirably mounted on a printed circuit board.

Placing all the electrical and electronic components into one housing may desirably result in a single housing of a small size. Such small size, however, is accompanied by a reduction in the volume of the controller and in the mass available to dissipate the heat generated when high currents flow in the control system. The I-squared-R losses in the controller, as well as other losses in the system, such as contact resistance and the like, will result in heat generation in a controller with less space and less mass available to dissipate it. Therefore another aspect of the invention is a thermal management system. The invention includes several techniques to remove the heat generated when the control system is operated.

In one aspect of the invention, solid-state switches, such as MOSFETs, are mounted on a printed circuit board. In many MOSFETs, the drain comprises a larger mass than the gate or the source. In one aspect of the invention, the drains of the several MOSFETs or other switches are closely coupled for heat transfer among each other, such as by soldering them together. This also connects the drains electrically. However, even though the drains are connected electrically, the MOSFETs retain independent operation, since they conduct electricity only when their gates command it. The gate voltage of each MOSFET is controlled independently through the user-controlled switches. The drains may therefore be tied together thermally, without affecting the independent operation of the motors they control. Thus, while only one axis of motion is actuated at a given time, the drains of more than one MOSFET may help dissipate heat given off in operation by a single MOSFET, as it drives its motor to position the accessory.

Figure 5A:
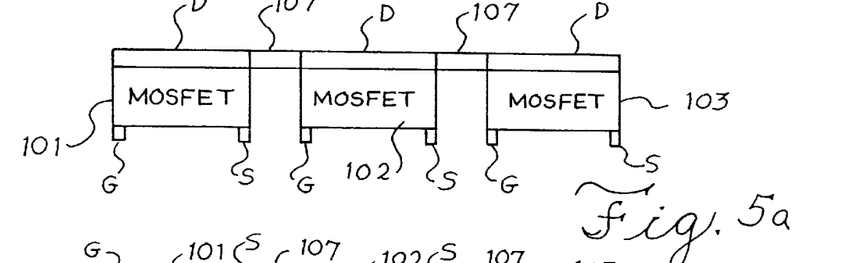
FIGS. 5a and 5b are top views of solid-state switches that form a thermal mass.
Figure 5B:
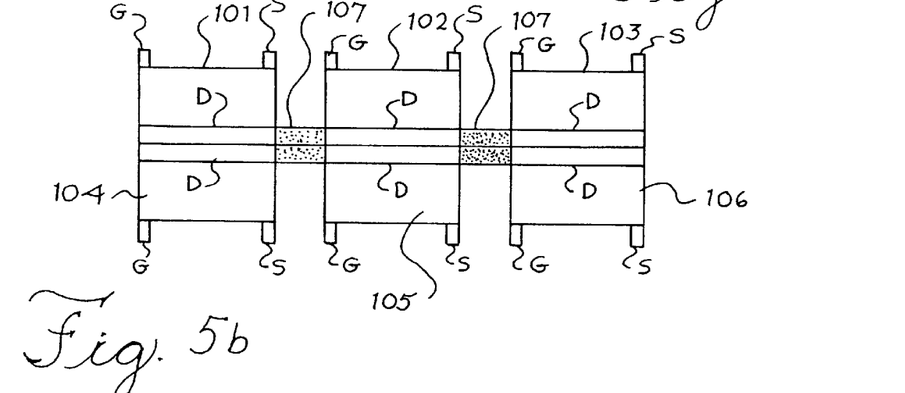

FIGS. 5a and 5b depict three MOSFETs 101, 102, and 103 used in the present invention, each having a drain, a source and a gate. The drains are tied together electrically with a large mass of thermally conductive material 107, such as solder, that acts to draw heat away from the MOSFET that is operating. The heat generated during operation of the accessory is thus conducted away by the thermal mass of more than one MOSFET's drain, and by any additional mass capable of absorbing heat. The heat is then desirably convected away from the MOSFETs to any surrounding air or other medium. FIG. 5a depicts three such MOSFETs arranged in a line on a printed circuit board (not shown), connected by solder 107, which acts to further draw heat away. FIG. 5b shows an alternate way to practice the invention in mounting MOSFETs 101 through 106, so that the drains have maximum thermal contact, while at the same time insuring that the gates and sources are electrically isolated.

In another aspect of the invention to control thermal rise, the MOSFETs are mounted on a heat sink, in such a manner that the gates and sources are electrically isolated from each other, and the drains may be in electrical contact with the heat sink, provided that the heat sink is electrically isolated. In another aspect, the MOSFETs are mounted on a printed circuit board, and the printed circuit board is designed to conduct heat away from the heat-producing components, and dissipate the heat from the opposite surface of the printed circuit board. Alternatively, the solid-state switches, or MOSFETs, may be mounted on a board or mounting separate from the other electrical or electronic components of the control system.

Figure 6A:
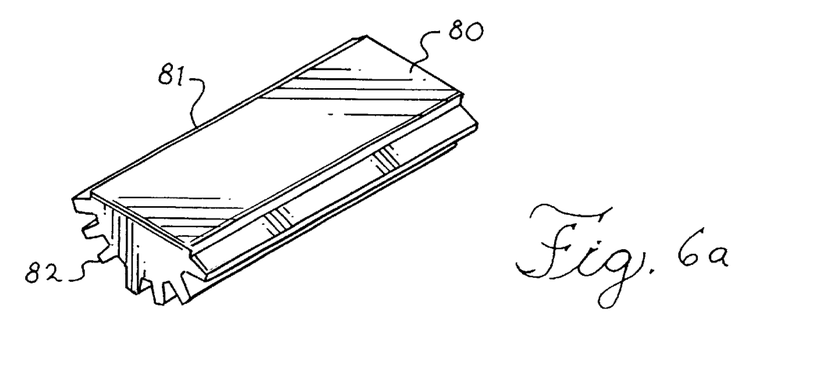
FIGS. 6a, 6b, and 6c are block diagrams of the components of the present invention mounted on several suitable mountings.
Figure 6B:
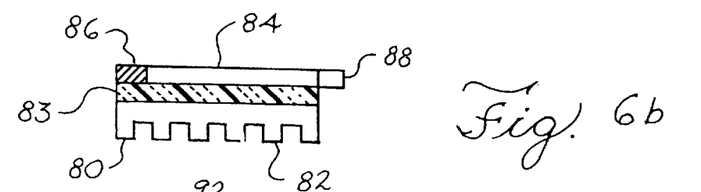
Figures 6C, 7A, 7B, 7C:
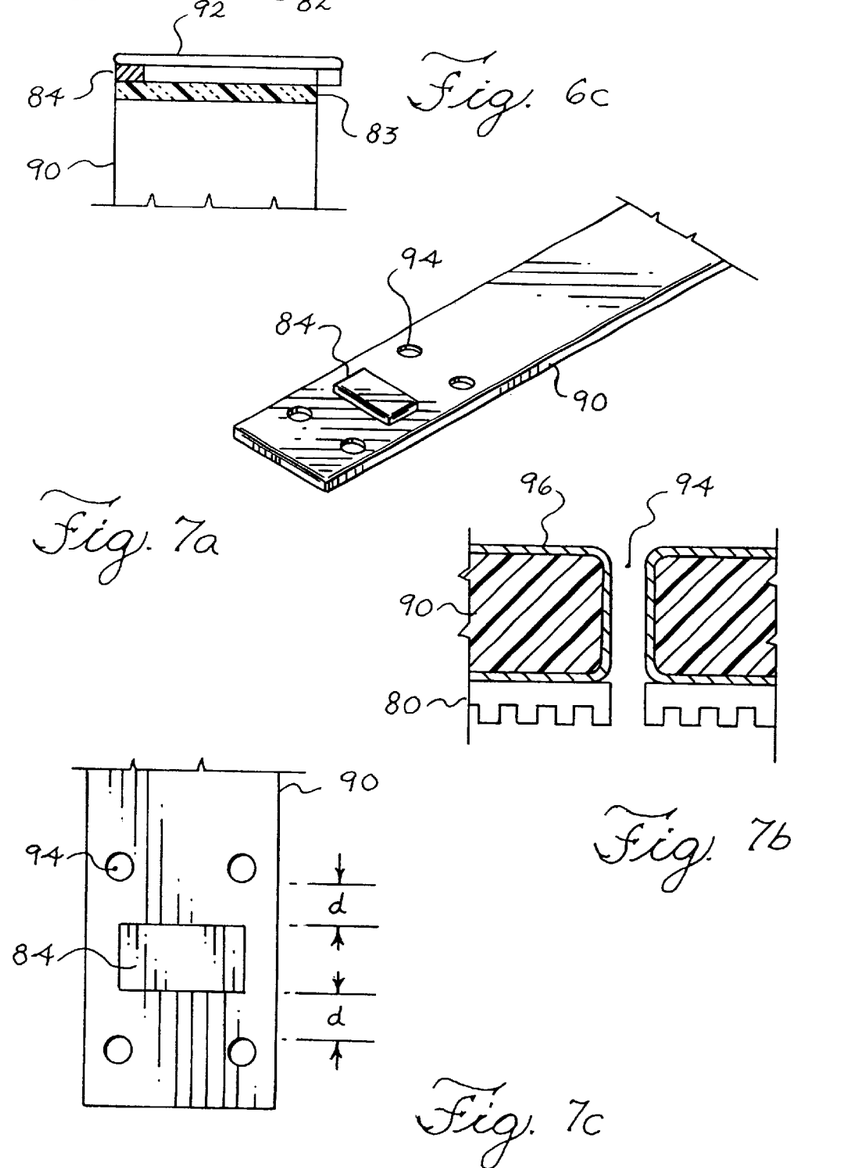
FIGS. 7a, 7b, and 7c are top and cross-sectional views of a circuit board with a thermal management capability.

FIGS. 6a, 6b, and 6c depict methods of using heat sinks to further conduct heat away from solid-state switches used in the present invention. FIG. 6a depicts a heat sink 80, typically made of a conductive metal, such as copper or aluminum that may be mounted to dissipate heat from a heat-producing component, such as a MOSFET. Such heat sinks may have fins or extended surfaces 82 on a side opposite to the contact surface 81. The object from which heat is to be removed is mounted to surface 81 and the extended surfaces 82 act to encourage the convection of heat away from the hot object. FIG. 6b depicts one method to mount the MOSFET 84 to the heat sink 80. It is desirable to use a thermal mounting compound 83 between the flat contact surface 81 (not shown) of the heat sink 80 and the MOSFET 84, for maximum thermal contact and conductivity. The MOSFET is mounted with care to insure electrical isolation of the working parts of the MOSFET, such as the drain 86 and the source or gate 88. FIG. 6c shows yet another way to practice the invention, by applying a pillow 92 filled with heat transfer compound atop a MOSFET 84 mounted to a printed circuit board 90, with or without an intermediate layer of thermal mounting compound 83. Heat transfer compounds to be used in the pillow desirably include, but are not limited to, those manufactured by the 3M Company under the tradename Fluorinert. These compounds are electrically insulative, chemically inert, and have high heat capacity and a high boiling point.

Electrical vias are also useful in helping dissipate heat. Even though many printed circuit boards now use surface-mounted components, and through-hole components will comprise at best a minority on many boards, yet it is useful to include electrical vias through the thickness of the board. These vias are holes through the thickness of the printed circuit board. They may be plated with a conductive metal, such as copper, and may have other metals, such as nickel, plated over the copper to serve other purposes. In another aspect of the invention, a printed circuit board is designed for heat dissipation in accordance with a postulated need for removing heat. This need is desirably ascertained by thermal analysis of the control system, the power requirements, the estimated electrical losses, and the perceived need for heat transfer away from the other electronic components, preferably mounted on one side of the board, and toward the other side of the board.

FIGS. 7a, 7b, and 7c depicts several views of a circuit board used in the present invention to mount heat-producing devices. The board features vias to draw heat away from the heat-producing devices as heat is generated. FIG. 7a depicts a printed circuit board 90 with through hole vias 94 and mounting a MOSFET 84. FIG. 7b depicts a cross-section of such a via 94 through the thickness of the circuit board 90. The via itself may be lined with copper plating 96 of a variable thickness, or the layer may be of some other conductive metal that is desirable for any other purpose, such as nickel or aluminum, for instance, to better resist corrosion. Alternatively, a plating material to line the via may be selected that is slightly less useful for conducting heat but has more electrical resistance, such as nickel. FIG. 7c shows one arrangement of vias 94 around a MOSFET 84, with the vias at a distance d from the MOSFET, said distance d desirably as small as possible. Vias may even be placed under the MOSFET if it is deemed desirable for thermal design.

In another aspect of the invention, the control system is equipped with memory for storing predetermined positions of the accessory. Thus, a driver of a vehicle may have preferences for various positions of the axes of the driver's seat. These preferences are normally determined manually, by adjusting the manual switches of the control until the driver is satisfied. In this aspect of the invention, the control system includes a memory, desirably a semiconductor memory, and a means for indicating to the memory the positions desired to be stored. This may be accomplished by buttons or switches on the control system, such as "set" and "User #1" and "User #2" or the like. If it is desired for the memory to store more than one position or set of positions, the method for storing and recalling must be commensurate. Typically, there is a separate button for each user to recall the stored positions, or there may be a simpler method, such as the number of taps on a "user #" button, followed by a "recall" switch. Those skilled in programming arts will realize there are many ways to accomplish the tasks of storing and recalling.

In another aspect of the invention, the control system is able to compute the travel and restore the accessory to a desired position, regardless of where the accessory is positioned on its axis. In order to accomplish this, the control system must have an ability to know the position of the accessory at all times. This is conventionally accomplished by a number of ways, including resolvers on the bi-directional motors, by proximity sensors able to track position, and by current sensors that measure current commutation pulses to the motor and calculate the resulting travel. It is preferable, however, to accomplish this tracking without adding sensors or wires to the equipment that must be installed.

Elimination of the harnesses is made easier if no feedback sensor is needed at the location of the motor or accessory, to inform the microcontroller of the position of the vehicle accessory. Techniques are available for monitoring the current to the motor and thereby inferring the position of the accessory. Bi-directional motors typically used in such accessories have two or more poles that are commutated as the motor rotates. A current transformer or a sensing resistor in the power circuit is sensitive to the variations in current, which occur twice from each pole during one rotation. Thus, a four-pole motor will have eight commutations and eight variations in current during one rotation. The travel of the accessory may be calculated from the number of rotations of the motor. The accuracy of this technique depends on the number of poles, since the greater the number of poles, the more accurate will be the calculation of motor position.

Commutation pulse detection (CPD) is a technique using this information to compute the number of revolutions of a motor of a given number of poles. In addition to counting pulses, smart CPD systems contain algorithms to account for errors and inaccuracies, as well as fluctuations of current, in such motorized systems. One such technique, described in U.S. Pat. No. 5,497,326, has been found highly desirable, is assigned to the assignee of the present application, and is incorporated by reference. This aspect of the invention allows greater versatility, an improved use of the memory feature, and, beyond semiconductor memory, requires no extra parts or wiring harnesses to install.

Therefore, it is preferable to use commutation pulse detection (CPD) to track position on each axis of motion, and to provide this information to the memory. Thus, the microcontroller will know at all times the position of each axis, and can compute the distance and direction necessary to move the accessory to predetermined stored positions, such as those of driver #1 or driver #2.

Figures 8A, 8B:
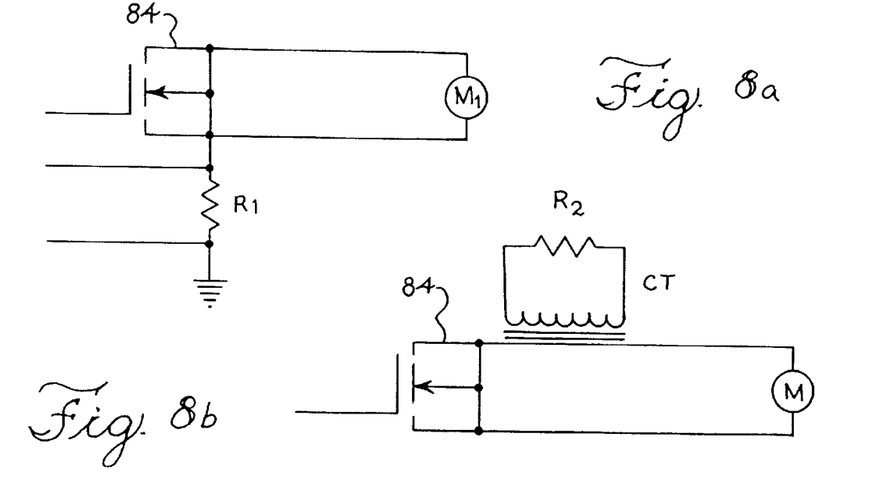
FIGS. 8a and 8b are schematic diagrams of two different methods to achieve positional information on the accessory without using remote sensors.

FIGS. 8a and 8b depict two ways to take advantage of this technique. FIG. 8a depicts a MOSFET 84 powering a remote motor. Resistor R1 measures the voltage drop between the source and ground. This voltage will vary as the current supplied by the MOSFET varies. The signal from R1 may be processed by conventional signal processing techniques and used to infer the travel of the accessory from the rotation of the motor. If the last position of the accessory was known, the distance and direction of travel may be calculated based on the number of pulses detected by signal processing techniques from the signal of Resistor R1. In a similar manner, FIG. 8b depicts a current transformer tapping the drain of MOSFET 84, which powers a remote motor. The current detected by the current transformer (CT) will vary slightly as the motor commutates. By measuring the drop across a resistor R2 in series with the CT.

In another aspect of the invention, the application is not limited to motorized accessories. Thus, it may be desirable to include an additional function, such as heating a seat, in addition to the motorized accessories. This aspect of the invention will be useful particularly in versions equipped with a memory, wherein the seat temperature desired by at least one user is stored. Just as the motorized accessory is positioned by the control system at a command from a user, the seat temperature is achieved by a similar command. Instead of a motor, resistive heaters may be located at one or more than one locations in the seat, and heated by power applied through a solid-state switch, upon command by the system controller. In one preferred embodiment of the invention, a vehicle accessory includes a 6-way switch for motorized accessories described above, and also includes such heating capability and controls. In another preferred aspect, an 8-way switch incorporates both the 6 motorized functions and a heating capability into a single controller.

Figure 9:
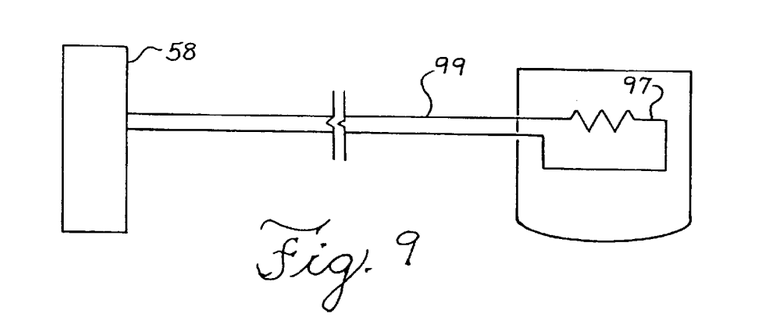
FIG. 9 is a diagram of the present invention using a heating capability.

Feedback is provided by measuring the voltage drop across the resistive heaters, or by providing a separate thermally sensitive resistor, such as a resistance temperature detector (RTD). Either of these takes advantage of the very accurate indication of temperature that may be achieved by its change in resistance with temperature. Other means for detection may also be used, such as thermocouples, but they require additional parts and additional wiring. Using an in-line RTD is an inherently safer method, since a broken wire cannot lead to thermal runaway. If the heating wire is broken, the electrical circuit is broken; but a separate thermal sensor could conceivably result in a thermal runaway condition. FIG. 9 depicts such an application, in which a resistive heater 97 is connected to an output connector 58 via electrical harness 99. As depicted in FIGS. 2, 3, and 4, the output connector 58 connects outputs to a means for supplying power, and the heater receives electric power to provide heat.

In another aspect of the invention, the control system is adapted to receive signals remotely from an operator. Thus, the control system may incorporate a radio receiver, responsive to signals from a radio transmitter, and instructing the control system to move to a particular stored position, such as position #1 or position #2. This may be desirable when the motorized accessory is a seat, and wherein the difference between the present and the stored position is great enough to cause discomfort, as when one user attempts to sit into a very shortened seat. Such an aspect may also be useful when such a control system is applied to other accessories on a motor vehicle. Thus, the control system may be adapted to a steering wheel, or a headrest, or may be applied to the operating pedals of a vehicle, such as an accelerator, a brake or a clutch. Such accessories will accommodate drivers that may be taller or shorter than a height that allows them to fit comfortably into the driver's seat without such adjustments.

Figure 10:
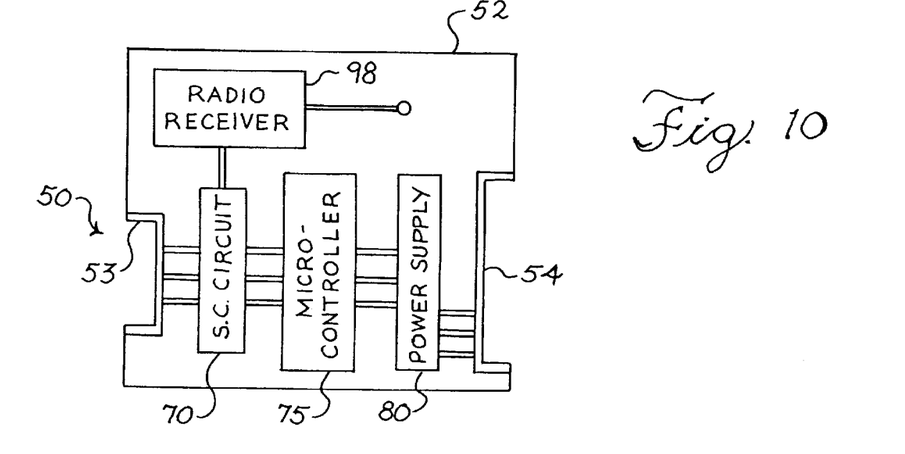
FIG. 10 is a diagram of the components of the present invention with a memory and with a remote signaling capability.

FIG. 10 depicts a control system 10 of the present invention incorporating such a radio receiver. Housing 52 includes an input connector 53 and an output connector 54. The controller 56 for controlling the functions of the accessories may be an 8-way switch. Other components may include a set button 66, User #1 button 68 and User #2 button 70, as well as a radio receiver 98, adapted to receive signals from a remote user using a radio transmitter (not shown) to send signals to the radio receiver. The inputs connect to signal conditioning circuitry 70, operably connected to a microcontroller 75. The control system also contains output controls 80 controlled by the 8-way switch and the buttons.

In another aspect of the invention, the control system can use non-contact switches as well as contact switches to actuate the controller for the accessory. The invention is not limited to the J-switches or other power switches for operation. The control system will work with any suitable means for signaling and controlling the power to the motorized accessory. These switches could include power switches, toggle switches, spring-loaded switches, or even capacitance switches.

The invention is not limited to automobiles. The motorized accessory may be part of a different locomotive system, other than automobiles. Thus, a motorized accessory such as a seat may desirably be used in trucks or boats. These motorized accessories may be used on off-road vehicles as well, such as farm tractors or mechanical harvesters, and they may be used on other industrial vehicles as well, such as front-end loaders, crawler tractors or earth-moving machinery, road graders, and the like.

While this invention has been shown and described in connection with the preferred embodiments, it is apparent that certain changes and modifications, in addition to those mentioned above, may be made from the basic features of this invention. Many types of solid-state switches besides MOSFETs may be used, such as power transistors, thyristors, and the like. Accessories besides seats may take advantage of this invention, such as windows, sunroofs, mirrors, headrests, and even non-motorized accessories, such as heaters or other electrical or electromagnetic devices without departing from the invention. Accordingly, it is the intention of the applicants to protect all variations and modifications within the valid scope of the present invention. It is intended that the invention be defined by the following claims, including all equivalents.

We claim:

1. A control system contained in a control housing for use with at least one bi-directional motor to position an accessory of a motorized vehicle, comprising:

a control housing;

a input connector mounted to the housing;

an output connector mounted to the housing;

solid state switches for supplying power to the motor, the solid state switches mounted inside the housing in a manner to dissipate heat and operably connected to the input connector; and manual switches for controlling the power mounted to the housing and operably connected to the output connector, wherein the solid state switches and manual switches are operably connected inside the housing.

2. The control system of claim 1, wherein the means for controlling comprise high-current manual switches.

3. The control system of claim 1, wherein the solid-state switches are mounted on a mounting selected from the group consisting of a printed circuit board, a heat sink, and a printed circuit board with a thermal management system.

4. The control system of claim 3, wherein the drains of the solid state switches are tied together to form a thermal mass.

5. The control system of claim 3, further comprising a microcontroller that receives actuating signals from the manual switches, and controls the switching of the solid-state switches.

6. The control system of claim 3, wherein the means for controlling comprise non-contact switches selected from the group consisting of proximity switches and capacitance switches.

7. The control system of claim 3 further comprising an accessory selected from the group consisting of a seat, a window, a mirror, a sunroof, a steering wheel, and an operating pedal selected from the group consisting of an accelerator, a brake, and a clutch, wherein the at least one bi-directional motor is connected to position the accessory.

8. The control system of claim 7 further comprising a motorized vehicle selected from the group consisting of an automobile, a boat, a truck, a tractor, a farm vehicle or an off-road industrial vehicle, wherein the accessory is mounted to the motorized vehicle.

9. The control system of claim 5, wherein the microcontroller further comprises routines for speed control, current control, soft stop, and a routine to detect obstructions.

10. A method of positioning an accessory of a motorized vehicle, comprising the steps of:

providing at least one bi-directional motor;

providing a DC power source for at least one motor;

providing a controller having solid-state power switches and control switches inside a control housing;

connecting said DC power source to the controller;

connecting the controller to at least one motor;

actuating the switches to position the accessory; and dissipating heat from the controller.

11. The method of claim 10, wherein the motorized vehicle is an automobile, a boat, a truck, a tractor, a farm vehicle or an off-road industrial vehicle.

12. The method of claim 11, wherein the accessory is selected from the group consisting of a seat, a window, a mirror, a sunroof, a steering wheel, and an operating pedal selected from the group consisting of a clutch, an accelerator and a brake.

13. A control system contained in a control housing, the control system having memory for use with a bi-directional motor to position an accessory of a motorized vehicle, comprising:

a control housing;

an input connector mounted to the housing;

an output connector mounted to the housing;

solid state switches for supplying power to the motor, the solid state switches mounted inside the housing in a manner to dissipate heat and operably connected to the input connector; and manual switches for controlling the power mounted inside the housing, the manual switches operably connected to the output connector, wherein the solid state switches and the manual switches are operably connected in the housing, and the solid state switches are responsive to the memory to automatically position the accessory upon command.

14. The control system claim 13, wherein the accessory has more than one axis of movement, and further comprising a bi-directional motor for each axis of movement, solid state switches for supplying power to each motor, manual switches for controlling the power to each motor, the solid state switches and manual switches connected in the housing, and wherein the solid state switches are responsive to the memory to automatically position the accessory upon command.

15. The control system of claim 14, wherein the memory is semiconductor memory and is capable of storing one or more predetermined settings for the position of the accessory and further comprising a microcontroller that receives actuating signals from the manual switches and controls the switching of the solid state switches.

16. The control system of claim 15, wherein the solid-state switches and the memory are mounted inside the housing on a mount selected from the group consisting of a printed circuit board, a heat sink, and a printed circuit board with a thermal management system.

17. The control system of claim 15, wherein the drains of the solid state switches are tied together to form a thermal mass.

18. The control system of claim 15, further comprising selector switches communicating with the memory to command the control system to position the accessory to pre-determined positions.

19. The control system of claim 15, further comprising a receiver adapted to receive remote signals to command the control system to position the accessory to pre-determined positions.

20. The control system of claim 15, further comprising an accessory selected from the group consisting of a seat, a window, a sunroof, a headrest, a steering wheel, and an operating pedal selected from the group consisting of an accelerator, a brake, and a clutch.

21. The control system of claim 14, wherein the manual switches comprise non-contact switches selected from the group consisting of proximity switches and capacitance switches.

22. The control system of claim 18, further comprising means for determining the distance and direction of travel of the accessory, and wherein said control system automatically computes and stores the travel necessary to position the accessory in one or more stored pre-determined position upon command.

23. The control system of claim 18, wherein the means for determining the distance and direction of travel is selected from the group consisting of a commutation pulse detection system, a resolver system, proximity sensors and current sensors.

24. The control system of claim 15, wherein the microcontroller further comprises routines for speed control, current control, soft start and soft stop, and a routine to detect obstructions.

25. The control system of claim 20 further comprising a motorized vehicle selected from the group consisting of an automobile, a boat, a truck, a tractor, a farm vehicle and an off-road industrial vehicle, wherein the accessory is mounted to the motorized vehicle.

26. The control system of claim 13, wherein the means for supplying power comprises a solid-state switch, the means for controlling the power comprises at least one manual switch, and the memory is semiconductor memory.

27. The control system of claim 26, further comprising means for supplying electric power to a heater and means for controlling the power to the heater.

28. The control system of claim 27, wherein the means for supplying electric power to a heater comprise solid state switches and the means for controlling the power comprise a switch and a resistance temperature detector.

29. A method of automatically positioning an accessory of a motorized vehicle comprising:

providing at least one bi-directional motor;

providing a DC power source for at least one motor;

providing a controller having solid state power switches and control switches inside a control housing, said controller having a memory capable of recalling one or more pre-determined positions of the accessory, and means for commanding the bi-directional motor;

connecting the DC power source to the controller;

connecting the controller to at least one motor;

signaling the controller to position the accessory; and dissipating heat from the controller.

30. The method of claim 29, further comprising manual switches to signal the controller to position the accessory.

31. The method of claim 29, wherein the controller is adapted to receive a remote signal that commands the controller to position the accessory.

32. The method of claim 29, wherein the accessory is selected from the group consisting of a seat, a window, a mirror, a sunroof, a steering wheel, and an operating pedal selected from the group consisting of an accelerator, a brake, and a clutch.

33. The method of claim 29, wherein the method further comprises controlling the temperature supplied by a heater, said controller further comprising means for supplying electric power to a heater and means for controlling the power to the heater.

34. The method of claim 29, wherein the motorized vehicle is selected from the group consisting of an automobile, a truck, a farm vehicle or an off-road industrial vehicle.

* * * * *

UNITED STATES PATENT AND TRADEMARK OFFICE
CERTIFICATE OF CORRECTION

PATENT NO. : 6,538,405 B1
DATED : March 25, 2003
INVENTOR(S) : Mark Brzozowski et al.

It is certified that error appears in the above-identified patent and that said Letters Patent is hereby corrected as shown below:

<u>Column 10,</u>
Line 52, insert -- includes memory and -- before "further comprises".
Line 53, insert -- soft start and -- before "soft stop,".

<u>Column 11,</u>
Line 60, delete "clutch." and substitute -- clutch, wherein the control system adjusts at least one of an accessory and an operating pedal in response to a user of a motor vehicle. -- in its place.

<u>Column 12,</u>
Line 11, insert -- inlcudes memory and -- before "further comprises".

Signed and Sealed this

Twentieth Day of April, 2004

JON W. DUDAS
*Acting Director of the United States Patent and Trademark Office*